(12) United States Patent
Nanba et al.

(10) Patent No.: US 10,403,518 B2
(45) Date of Patent: Sep. 3, 2019

(54) SUBSTRATE PROCESSING METHOD, SUBSTRATE PROCESSING APPARATUS AND RECORDING MEDIUM

(71) Applicant: Tokyo Electron Limited, Tokyo (JP)

(72) Inventors: Hiromitsu Nanba, Koshi (JP); Tatsuhiro Ueki, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/759,932

(22) PCT Filed: Sep. 14, 2016

(86) PCT No.: PCT/JP2016/077075
§ 371 (c)(1),
(2) Date: Mar. 14, 2018

(87) PCT Pub. No.: WO2017/047625
PCT Pub. Date: Mar. 23, 2017

(65) Prior Publication Data
US 2018/0269076 A1   Sep. 20, 2018

(30) Foreign Application Priority Data
Sep. 16, 2015   (JP) ................................. 2015-183253

(51) Int. Cl.
*H01L 21/67* (2006.01)
*C09K 13/04* (2006.01)
(Continued)

(52) U.S. Cl.
CPC .......... *H01L 21/6708* (2013.01); *C03C 15/00* (2013.01); *C09K 13/04* (2013.01);
(Continued)

(58) Field of Classification Search
CPC ........... H01L 21/6708; H01L 21/32134; H01L 21/02087; H01L 21/67051;
(Continued)

(56) References Cited

U.S. PATENT DOCUMENTS

| 2002/0127859 A1* | 9/2002 | Wu ................... H01L 21/02032 |
| | | 438/689 |
| 2004/0026692 A1* | 2/2004 | Ota ................... H01L 21/02087 |
| | | 257/40 |

(Continued)

FOREIGN PATENT DOCUMENTS

| JP | 54-137975 A | 10/1979 |
| JP | 2008-047629 A | 2/2008 |

(Continued)

OTHER PUBLICATIONS

International Search Report for PCT/JP2016/077075 dated Nov. 15, 2016.

*Primary Examiner* — Duy Vu N Deo
(74) *Attorney, Agent, or Firm* — Pearne & Gordon LLP

(57) ABSTRACT

A plasma processing method includes etching a removing target film by supplying onto a peripheral portion of a substrate being rotated a first processing liquid containing hydrofluoric acid and nitric acid at a first mixing ratio; and etching the removing target film by, after supplying the first processing liquid onto the substrate, supplying onto the peripheral portion of the substrate being rotated a second processing liquid containing the hydrofluoric acid and the nitric acid at a second mixing ratio in which a content ratio of the hydrofluoric acid is lower and a content ratio of the nitric acid is higher than in the first processing liquid. When removing the removing target film made of SiGe, amorphous silicon or polysilicon from the peripheral portion thereof, an underlying film, for example, a film made of $SiO_2$, which exists under the removing target film, can be appropriately left.

5 Claims, 6 Drawing Sheets

(51) Int. Cl.
  *C03C 15/00* (2006.01)
  *H01L 21/02* (2006.01)
  *H01L 21/3213* (2006.01)
  *H01L 21/306* (2006.01)

(52) U.S. Cl.
  CPC .. *H01L 21/02087* (2013.01); *H01L 21/32134* (2013.01); *H01L 21/67051* (2013.01); *H01L 21/02071* (2013.01); *H01L 21/30604* (2013.01)

(58) Field of Classification Search
  CPC ........ H01L 21/30604; H01L 21/02071; C09K 13/04; C03C 15/00
  See application file for complete search history.

(56) References Cited

U.S. PATENT DOCUMENTS

| | | | | |
|---|---|---|---|---|
| 2004/0084144 | A1* | 5/2004 | Yokouchi | C03C 15/00 156/345.11 |
| 2011/0062114 | A1* | 3/2011 | Mizuno | H01L 21/02087 216/83 |

FOREIGN PATENT DOCUMENTS

| | | |
|---|---|---|
| JP | 2009-117762 A | 5/2009 |
| JP | 2011-066194 A | 3/2011 |
| JP | 2013-065614 A | 4/2013 |

\* cited by examiner

SUBSTRATE PROCESSING METHOD, SUBSTRATE PROCESSING APPARATUS AND RECORDING MEDIUM

CROSS-REFERENCE TO RELATED APPLICATION

This Application is a U.S. national phase application under 35 U.S.C. § 371 of PCT Application No. PCT/JP2016/077075 filed on Sep. 14, 2016, which claims the benefit of Japanese Patent Application No. 2015-183253 filed on Sep. 16, 2015, the entire disclosures of which are incorporated herein by reference.

TECHNICAL FIELD

The various embodiments described herein pertain generally to a technique of wet-etching a film formed on a peripheral portion of a substrate.

BACKGROUND ART

In the manufacture of a semiconductor device, a process called bevel etching is performed to remove an unnecessary film from a peripheral portion of a substrate such as a semiconductor wafer including a bevel portion thereof by using a chemical liquid. A film required to be left often exists under the film required to be removed. In this case, if etching selectivity of the film required to be removed against the film required to be left is not sufficiently high, an etching rate needs to be suppressed low in order to minimize an etching amount of the film required to be left.

Described in Patent Document 1 is a substrate processing method of performing bevel etching. In this method, when the etching rate needs to be increased, a high-concentration chemical liquid such as hydrofluoric acid is supplied to a peripheral portion of a substrate being rotated from a first nozzle. When the etching rate needs to be reduced, on the other hand, pure water (DIW) is supplied to the peripheral portion of the substrate from a second nozzle while the high-concentration chemical liquid is being supplied from the first nozzle to the peripheral portion of the substrate being rotated, so that the chemical liquid supplied from the first nozzle can be diluted.

However, this method of controlling the etching rate by the combination of the hydrofluoric acid and the pure water may not be applicable to a case where the removing target film is made of SiGe, amorphous silicon or polysilicon.

REFERENCES

Patent Document 1: Japanese Patent Laid-open Publication No. 2008-047629

SUMMARY OF THE INVENTION

In view of the foregoing, exemplary embodiments provide a technique of appropriately leaving an underlying film made of $SiO_2$ or the like, which exists under a removing target film made of SiGe, amorphous silicon or polysilicon, when removing the removing target film from a peripheral portion of a substrate by wet etching.

In one exemplary embodiment, a substrate processing method of processing a peripheral portion of a substrate includes a substrate rotating process of holding and rotating the substrate having an underlying film and a removing target film which is formed on the underlying film and made of any one of silicon germanium, amorphous silicon and polysilicon; a first processing process of etching the removing target film by supplying onto the peripheral portion of the substrate being rotated a first processing liquid containing hydrofluoric acid and nitric acid at a first mixing ratio; and a second processing process of etching the removing target film by, after supplying the first processing liquid onto the substrate, supplying onto the peripheral portion of the substrate being rotated a second processing liquid containing the hydrofluoric acid and the nitric acid at a second mixing ratio in which a content ratio of the hydrofluoric acid is lower and a content ratio of the nitric acid is higher than in the first processing liquid.

In another exemplary embodiment, there is provided a computer-readable recording medium having stored thereon computer-executable instructions that, in response to execution by a computer constituting a control device of a substrate processing apparatus, cause the substrate processing apparatus to control the control device to perform the above-described substrate processing method.

In still another exemplary embodiment, a substrate processing apparatus of processing a substrate having an underlying film and a removing target film which is formed on the underlying film and made of any one of silicon germanium, amorphous silicon and polysilicon includes a substrate holding mechanism configured to hold and rotate the substrate; a processing liquid supply unit configured to supply a processing liquid containing hydrofluoric acid and nitric acid onto a peripheral portion of the substrate held by the substrate holding mechanism; and a control unit configured to control the substrate holding mechanism and the processing liquid supply unit. The processing liquid supply unit is configured to supply a first processing liquid containing the hydrofluoric acid and the nitric acid at a first mixing ratio and a second processing liquid containing the hydrofluoric acid and the nitric acid at a second mixing ratio in which a content ratio of the hydrofluoric acid is lower and a content ratio of the nitric acid is higher than in the first processing liquid. The control unit is configured to control the substrate holding mechanism to rotate the substrate, and control the processing liquid supply unit to supply the first processing liquid onto the peripheral portion of the substrate being rotated and then supply the second processing liquid onto the peripheral portion of the substrate being rotated.

According to the exemplary embodiments, when removing the removing target film made of SiGe, amorphous silicon or polysilicon from the peripheral portion of the substrate by the wet etching, the underlying film which exists under the removing target film can be appropriately left.

DETAILED DESCRIPTION

Figure 1:
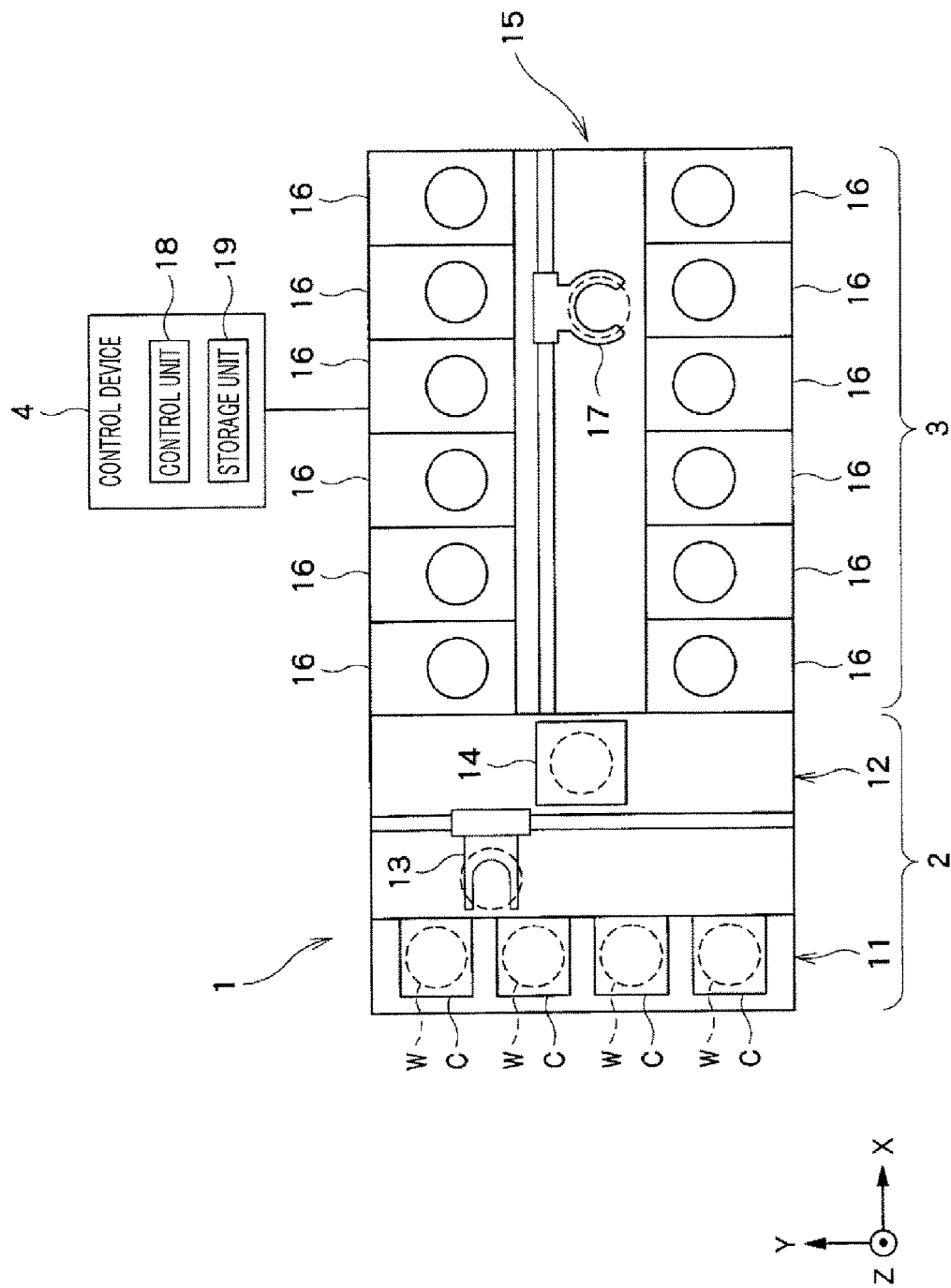
FIG. 1 is a plan view illustrating an outline of a plasma processing system according to an exemplary embodiment.

FIG. 1 is a plan view illustrating an outline of a substrate processing system provided with a processing unit according to an exemplary embodiment. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a control unit 18 and a storage unit 19. The storage unit 19 stores a program that controls various processings performed in the substrate processing system 1. The control unit 18 controls the operations of the substrate processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the delivery unit 14. The wafer W placed on the delivery unit 14 is taken out from the delivery unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

A configuration of the processing unit 16 will be explained with reference to FIG. 2. The processing unit 16 is equipped with a chamber 20, a substrate holding mechanism 30, a processing fluid supply unit 40, and a recovery cup 50.

The substrate holding mechanism 30 is provided with a substrate holding unit 31, a shaft unit 32, and a driving unit 33. The driving unit 33 rotates the substrate holding unit 31 via the shaft unit 32, so that the wafer W held by the substrate holding unit 31 horizontally is rotated around the vertical axis. The substrate holding unit 31 is implemented by, by way of non-limiting example, a vacuum chuck.

The processing fluid supply unit (processing liquid supply unit) 40 is equipped with a chemical liquid nozzle 41 configured to supply nitrohydrofluoric acid onto a peripheral portion of a top surface of the wafer W; a rinse nozzle 42 configured to supply, for example, pure water (DIW) as a rinse liquid onto the peripheral portion of the top surface of the wafer W; and a pre-processing nozzle 43 configured to supply an organic material cleaning solution (e.g., SC-1, SPM, etc.) as a pre-processing liquid onto the peripheral portion of the top surface of the wafer W.

The chemical liquid nozzle 41 is connected to a first nitrohydrofluoric acid supply source 44a and a second nitrohydrofluoric acid supply source 45a. The first nitrohydrofluoric acid supply source 44a is configured to supply hydrofluoric acid-rich nitrohydrofluoric acid (for example, having a volume ratio of $HF:HNO_3=1:10$). The second nitrohydrofluoric acid supply source 45a is configured to supply nitric acid-rich nitrohydrofluoric acid (for example, having a volume ratio of $HF:HNO_3=1:100$). A flow rate control valve 44b and an opening/closing valve 44c are provided at a pipeline between the first nitrohydrofluoric acid supply source 44a and the chemical liquid nozzle 41, and a flow rate control valve 45b and an opening/closing valve 45c are provided at a pipeline between the second nitrohydrofluoric acid supply source 45a and the chemical liquid nozzle 41. Accordingly, the hydrofluoric acid-rich nitrohydrofluoric acid or the nitric acid-rich nitrohydrofluoric acid can be supplied to the chemical liquid nozzle 41 selectively at a controlled flow rate.

The rinse nozzle 42 is connected to a pure water supply source 46a via a pipeline which is provided with a flow rate control valve 46b and an opening/closing valve 46c. The pre-processing nozzle 43 is connected to a pre-processing liquid supply source 47a via a pipeline which is provided with a flow rate control valve 47b and an opening/closing valve 47c.

Figure 2:
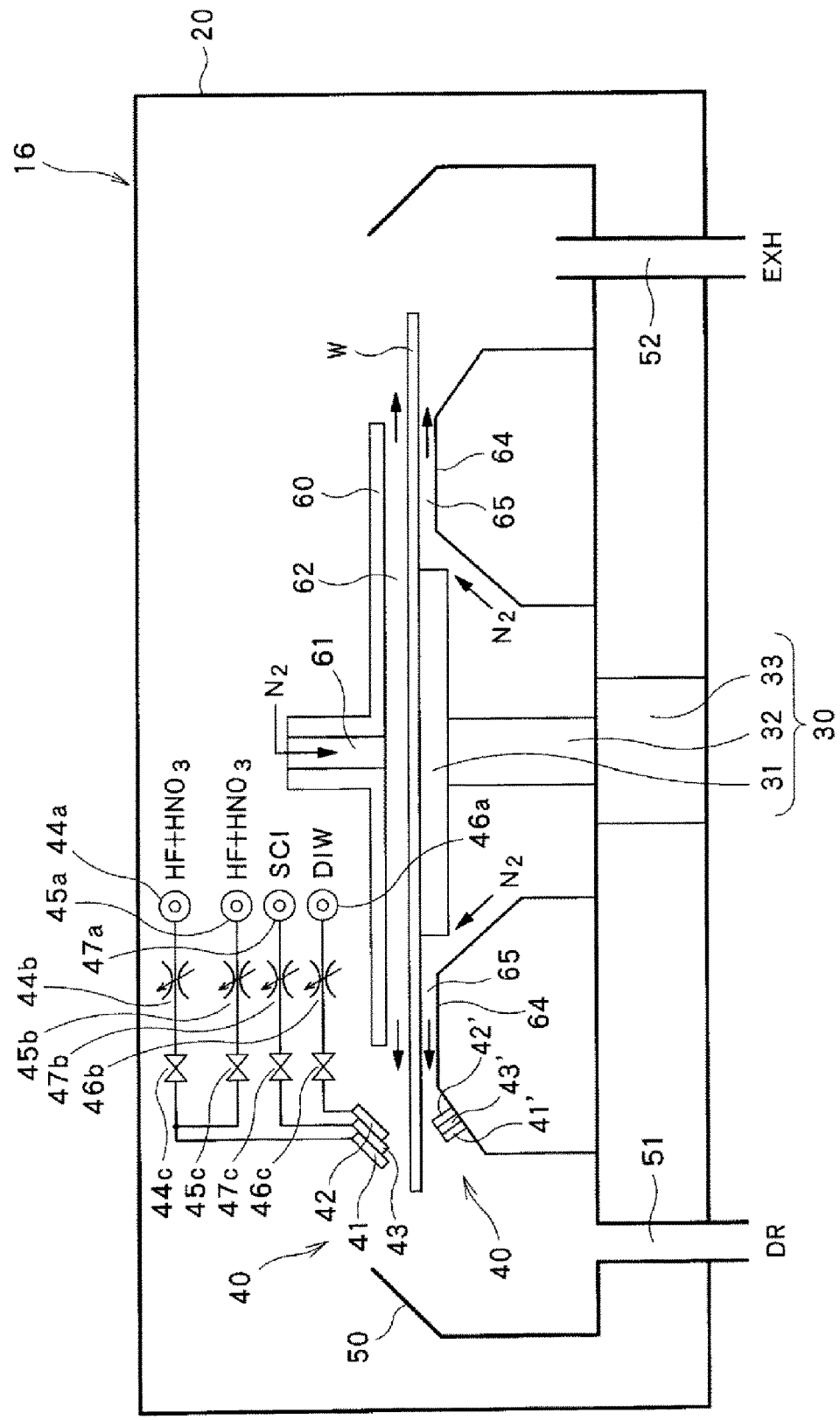
FIG. 2 is a longitudinal cross sectional view illustrating a schematic configuration of a processing unit belonging to the substrate processing system of FIG. 1.

The chemical liquid nozzle 41, the rinse nozzle 42 and the pre-processing nozzle 43 are held by a non-illustrated nozzle arm, and are configured to be movable between a processing position above the peripheral portion of the wafer W shown in FIG. 2 and a standby position at an outside of the recovery cup 50 in a radial direction.

A chemical liquid nozzle for supplying the hydrofluoric acid-rich nitrohydrofluoric acid onto the wafer W and a chemical liquid nozzle for supplying the nitric acid-rich nitrohydrofluoric acid onto the wafer W may be respectively provided.

The recovery cup 50 is configured to collect the processing liquid scattered from the wafer W after being supplied onto the wafer W which is being rotated. At a bottom of the recovery cup 50, a liquid drain port 51 configured to drain the processing liquid collected by the recovery cup 50 to the outside of the processing unit 16 and an exhaust port 52 configured to exhaust an atmosphere within the recovery cup 50 to the outside of the processing unit 16 are provided.

A top plate 60 is provided to suppress the liquids discharged from the chemical liquid nozzle 41, the rinse nozzle 42 and the pre-processing nozzle 43 from adhering to a central portion of the wafer W. The top plate 60 is configured to be movable by a non-illustrated moving mechanism between a processing position near and above a front surface (top surface) of the wafer W shown in FIG. 2 and a retreat position retreated from this processing position. A purge gas, for example, a nitrogen gas is supplied into a gap 62 between the top plate 60 and the wafer W through a gas supply path 61 provided at a center of the top plate 60. The purge gas is flown from the gap 62 outwards in the radial direction, thus suppressing the liquids from adhering to the central portion of the wafer W.

An under plate 64 is provided to suppress the liquids from adhering to a central portion of a rear surface of the wafer W. The under plate 64 may be provided as a part of the recovery cup. A purge gas, for example, a nitrogen gas is supplied into a gap 65 between the under plate 64 and the wafer W. This purge gas is flown from the gap 65 outwards in the radial direction, thus suppressing the liquids from adhering to the central portion of the rear surface of the wafer W.

As illustrated in FIG. 2, the processing fluid supply unit 40 may be further equipped with a chemical liquid nozzle 41' configured to supply the nitrohydrofluoric acid onto a peripheral portion of the rear surface of the wafer W; a rinse nozzle 42' configured to supply, for example, the pure water (DIW) as the rinse liquid onto the peripheral portion of the rear surface of the wafer W; and a pre-processing nozzle 43' configured to supply the organic material cleaning solution as the pre-processing liquid onto the peripheral portion of the rear surface of the wafer W. In this case, the nozzles 41', 42' and 43' are provided with the same processing liquid supply mechanisms as those provided with the above-described nozzles 41, 42 and 43.

Figure 3:
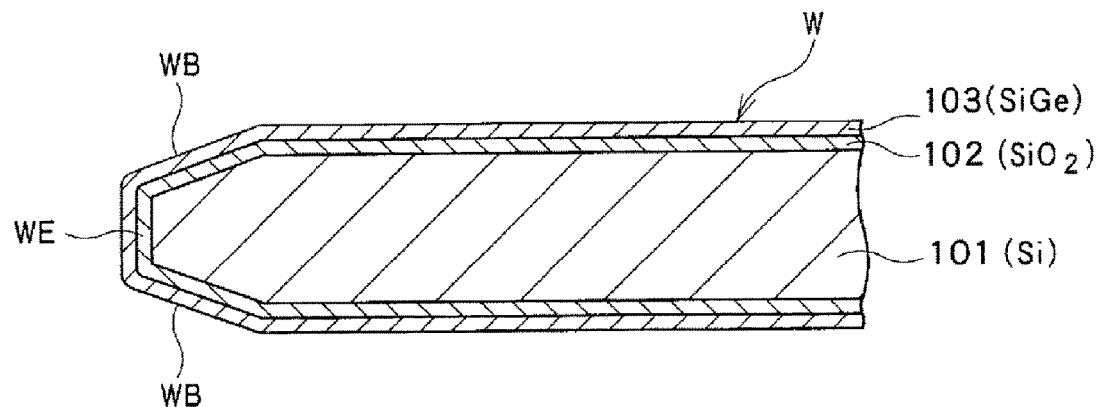
FIG. 3 is a schematic cross sectional view illustrating an example film formed on a wafer.
Figure 4:
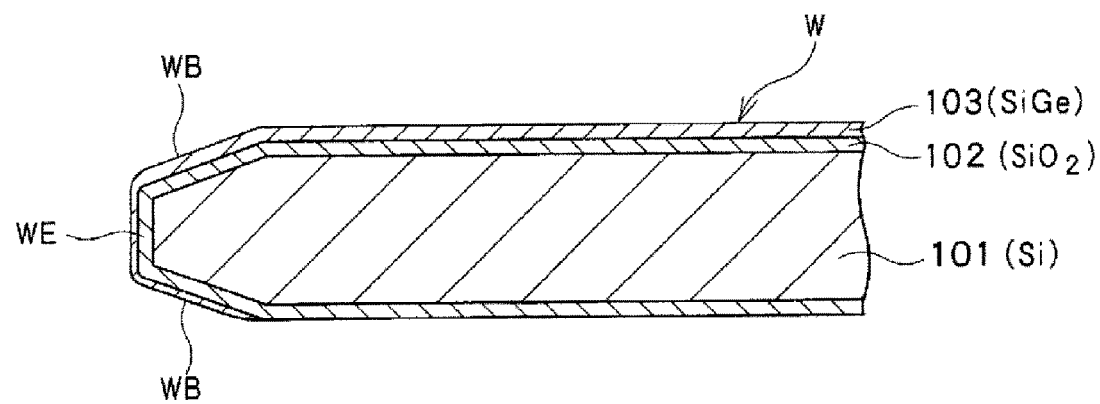
FIG. 4 is a schematic cross sectional view illustrating another example film formed on the wafer.

This configuration is effective when a removing target film (SiGe film) is formed on the entire peripheral portions of the front and rear surfaces of the wafer W as a processing target, as shown in FIG. 3. As shown in FIG. 4, if the removing target film (SiGe film) is formed only on the front surface of the wafer W and a bevel portion of the rear surface of the wafer W, the nozzle 41' may not be provided (as will be described later in further detail).

Now, a processing (bevel etching) performed on the wafer W by using the above-described processing unit 16 will be explained. Individual processes to be described below are performed automatically under the control of the control device 4. At this time, the control device 4 executes control programs stored in the storage unit 19, so that the individual components of the processing unit 16 are operated to implement processing parameters defined in processing recipes stored in the storage unit 19.

Figure 5:
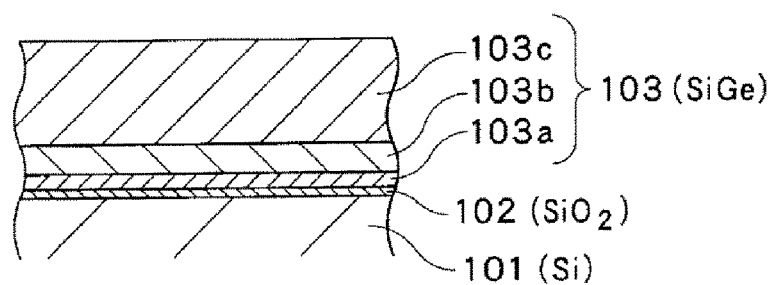
FIG. 5 is a schematic cross sectional view illustrating a structure of the films shown in FIG. 3 and FIG. 4 in further detail.

As depicted in FIG. 3 or FIG. 4, a processing target substrate (hereinafter, referred to as "wafer") has, on a silicon wafer 101, a $SiO_2$ film 102 as a lower layer and a SiGe film 103 as an upper layer. As shown in FIG. 5, the SiGe film 103 has a multilayer structure originated from a film forming method thereof and has a first layer 103a, a second layer 103b and a third layer 103c in sequence from the bottom. The higher the layer is located, the higher a Ge composition ratio is, which is also caused by the film forming method. Here, both the $SiO_2$ film 102 and the SiGe film 103 are formed by a batch type film forming apparatus and are formed continuously on the entire regions of the front and rear surfaces of the wafer W, as illustrated in FIG. 3.

First, the wafer W is carried into the processing unit 16 and horizontally held by the substrate holding unit 31.

[Wafer Rotating Process]

Then, the wafer W is rotated around the vertical axis. The wafer W is continuously rotated until a series of processes to be described below is finished.

[Organic Material Removing Process]

Figure 6:
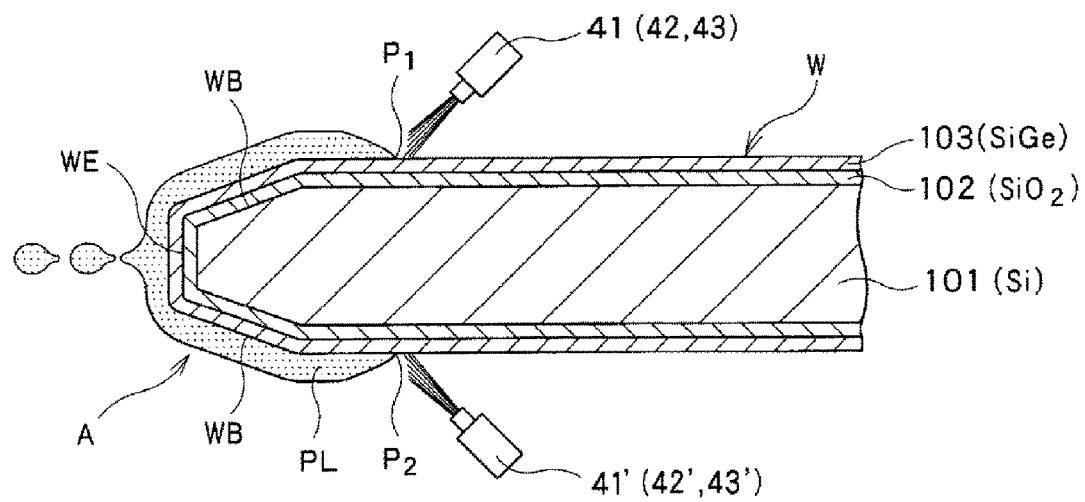
FIG. 6 is a schematic cross sectional view for describing a supply of a processing liquid onto the wafer and a flow of the processing liquid on the wafer.

Subsequently, as shown in FIG. 6, the SC-1 is supplied from the pre-processing nozzles 43 and 43' onto positions P1 and P2 within the peripheral portions of the wafer W including bevel portions WB of the front surface (device forming surface) of the wafer W being rotated. The SC-1 reaches a peripheral end WE (which is called an Apex) of the wafer W. Accordingly, a region A between the position P1 and the position P2 is entirely covered with the SC-1 solution PL. An organic material adhering to the region A as an etching target region of the wafer W is removed by the SC-1 solution. Finally, the SC-1 is scattered and removed from the wafer W by a centrifugal force. Further, in the following individual processes where the liquids (the nitrohydrofluoric acid and the DIW) are supplied to the wafer W, since movements of those liquids are the same as that of the SC-1, redundant description will be omitted.

[First Rinsing Process]

After the discharge of the SC-1 solution from the pre-processing nozzles 43 and 43' is stopped, the DIW is supplied from the rinse nozzles 42 and 42' onto the positions P1 and P2 on the wafer W being rotated. As a result, the SC-1 solution and a reaction product remaining on the peripheral portions of the front and rear surfaces of the wafer are washed away.

[First Nitrohydrofluoric Acid Processing Process (First Processing Process)]

After the discharge of the DIW from the rinse nozzles 42 and 42' is stopped, the hydrofluoric acid-rich nitrohydrofluoric acid is supplied at a preset flow rate from the chemical liquid nozzles 41 and 41' onto the positions P1 and P2 on the wafer W being rotated.

The SiGe film 103 is etched through the following mechanism.

First, Si in the SiGe film 103 is oxidized into silicon oxide by the nitric acid contained in the nitrohydrofluoric acid according to the following reaction formula.

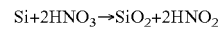

$$Si + 2HNO_3 \rightarrow SiO_2 + 2HNO_2$$

Subsequently, the silicon oxide is dissolved by the hydrofluoric acid contained in the nitrohydrofluoric acid according to the following reaction formula.

$$SiO_2 + 6HF \rightarrow H_2SiF_6 + 2H_2O$$

Figure 7A:
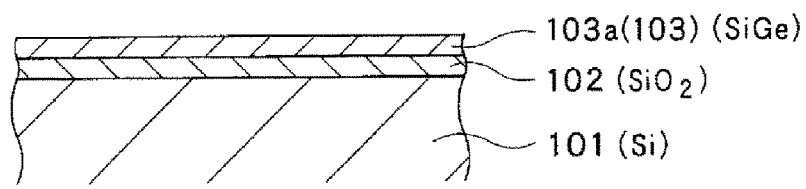
FIG. 7A and FIG. 7B are schematic cross sectional views illustrating a state of the film upon completion of a first and a second nitrohydrofluoric acid processing processes.
Figure 7B:
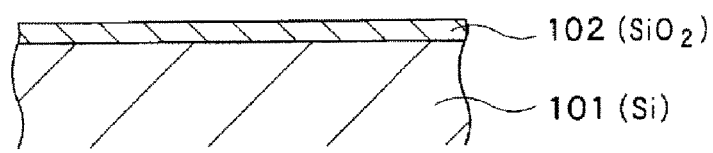

The hydrofluoric acid-rich nitrohydrofluoric acid etches the SiGe film 103 at a relatively high etching rate. This first nitrohydrofluoric acid processing process is performed for a time period required to remove the approximately entire Ge-rich upper layers (the second layer 103*b* and the third layer 103*c*) of the SiGe film 103, as shown in FIG. 7A. This required time period may be previously calculated by an experiment. As an example, when a film thickness of the third layer 103*c* ranges from 1100 nm to 1700 nm and a film thickness of the second layer 103*b* ranges from 270 nm to 550 nm, the processing time of the first nitrohydrofluoric acid processing process is set to be about 80 sec.

[Second Rinsing Process]

After the discharge of the nitrohydrofluoric acid from the chemical liquid nozzles 41 and 41' is stopped, the DIW is supplied from the rinse nozzles 42 and 42' onto the positions P1 and P2 of the wafer W being rotated. As a result, the nitrohydrofluoric acid and a reaction product remaining on the peripheral portions of the front and rear surfaces of the wafer W are washed away.

[Second Nitrohydrofluoric Acid Processing Process (Second Processing Process)]

After the discharge of the DIW from the rinse nozzles 42 and 42' is stopped, the nitric acid-rich nitrohydrofluoric acid is supplied at a preset flow rate from the chemical liquid nozzles 41 and 41' onto the positions P1 and P2 of the wafer W being rotated. The nitric acid-rich nitrohydrofluoric acid etches the SiGe film 103 at a relatively low etching rate. This second nitrohydrofluoric acid processing process is performed for a time period required to remove the entire Si-rich lower layer (the first layer 103*a*) of the SiGe film 103. This required time period may be previously calculated by an experiment. As an example, when the first layer 103*a* has a film thickness of 70 nm, the processing time of the second nitrohydrofluoric acid processing process may be set to about 120 sec.

At a portion where the SiGe film 103 is removed and the SiO₂ film 102 as an underlying film is exposed, the SiO₂ film 102 is also etched by the nitrohydrofluoric acid. However, an etching rate of the SiO₂ film 102 by the nitric acid-rich nitrohydrofluoric acid is relatively low. Accordingly, even if the etching by the nitrohydrofluoric acid is continued until the SiGe film 103 is completely removed from the entire region A, damage upon the SiO₂ film 102 can be suppressed low.

[Third Rinsing Process]

After the discharge of the nitrohydrofluoric acid from the chemical liquid nozzles 41 and 41' is stopped, the DIW is supplied from the rinse nozzles 42 and 42' onto the positions P1 and P2 of the wafer W being rotated. As a result, the nitrohydrofluoric acid and a reaction product remaining on the peripheral portions of the front and rear surfaces of the wafer W are washed away.

[Scattering and Drying Process]

After the discharge of the DIW from the rinse nozzles 42 and 42' is stopped, there is performed a scattering and drying process of scattering the DIW remaining on the wafer W through a centrifugal force by increasing a rotational speed of the wafer W, desirably. Before the scattering and drying process, the DIW remaining on the wafer W may be replaced with an organic solvent for drying such as IPA (isopropyl alcohol) supplied from a non-illustrated solvent nozzle.

Further, while the scattering and drying process is being performed, a drying gas such as a nitrogen gas or dry air supplied from a non-illustrated gas nozzle may be discharged in the vicinity of the processing target portion.

According to the above-described exemplary embodiment, by using the nitrohydrofluoric acids having the different mixing ratios of hydrofluoric acid/nitric acid when etching the SiGe film 103, the etching can be completed in a short time period, and the damage upon the underlying film can be suppressed. That is, by first performing the etching at the high etching rate with the hydrofluoric acid-rich nitrohydrofluoric acid, most of the SiGe film 103 can be removed in a short time. Then, by etching the thinly remaining SiGe film 103 at the low etching rate with the nitric acid-rich nitrohydrofluoric acid, the damage on the SiO₂ film 102 can be suppressed even when the underlying SiO₂ film 102 is exposed. Recently, the SiGe film may be formed to have a thickness of 2 μm to 3 μm, which is thicker than the conventional cases. In such a case, the SiGe film at the bevel portion can be removed in a short time without causing the damage on the underlying film. In this aspect, the above-described technique is advantageous.

In the above-described exemplary embodiment, an upper side film is the SiGe film, and a lower side film (underlying film) is SiO₂ film (silicon oxide). However, the exemplary embodiment is not limited thereto. By way of example, the upper side film may be formed of another material, such as amorphous silicon or polysilicon, which can be desirably etched by the nitrohydrofluoric acid. That is, according to the above-described exemplary embodiment, when both the upper side film and the lower side film (underlying film) are made of materials which can be easily etched by the nitrohydrofluoric acid, the upper side film can be removed in a short time while suppressing damage on the lower side film (underlying film). Further, the lower side film may be made of another material such as, but not limited to, SiN film.

Further, according to the above-described exemplary embodiment, since the organic material removing process is performed prior to the nitrohydrofluoric acid processing process (first nitrohydrofluoric acid processing process), the etching by the first and second nitrohydrofluoric acid processing processes can be performed uniformly. Since an organic material adhering to a front surface of an etching target film such as the SiGe film, the amorphous silicon film or the polysilicon film required to be etched by the nitrohydrofluoric acid hampers a reaction between these films and the nitrohydrofluoric acid, the etching might become non-uniform. By removing this organic material in advance, the etching by the nitrohydrofluoric acid can be performed uniformly.

In the above-described exemplary embodiment, though the nitrohydrofluoric acid, the organic material cleaning solution (SC-1) and the rinse liquid are supplied to the same position, the supply position of the organic material cleaning solution (SC-1) may be set to be a slightly inner position than the supply position of the nitrohydrofluoric acid in the radial direction, and the supply position of the rinse liquid may be set to be a slightly inner position than the supply position of the organic material cleaning solution in the radial direction.

In the above-described exemplary embodiment, though the semiconductor wafer is used as the processing target substrate, the processing target substrate is not limited thereto and may be of various types such as a glass substrate, a ceramic substrate, and so forth. The above-described method can also be used to etch films formed on these substrates by the nitrohydrofluoric acid.

Further, if the SiGe film is formed on a susceptor in a single substrate type processing apparatus, for example, the SiGe film is formed on the entire front surface of the wafer W, and a relatively thin SiGe film is also attached to the peripheral end WE of the wafer W and the bevel portion of the rear surface of the wafer W, as shown in FIG. 4. The SiGe film is not formed on a region of the rear surface of the wafer W between the center portion and the bevel portion of the wafer W. In this case, the processes after the first nitrohydrofluoric acid processing process can be performed according to the following sequence (the processes before the first nitrohydrofluoric acid processing process may be performed in the same way as in the above-described exemplary embodiment.

Figure 8A:
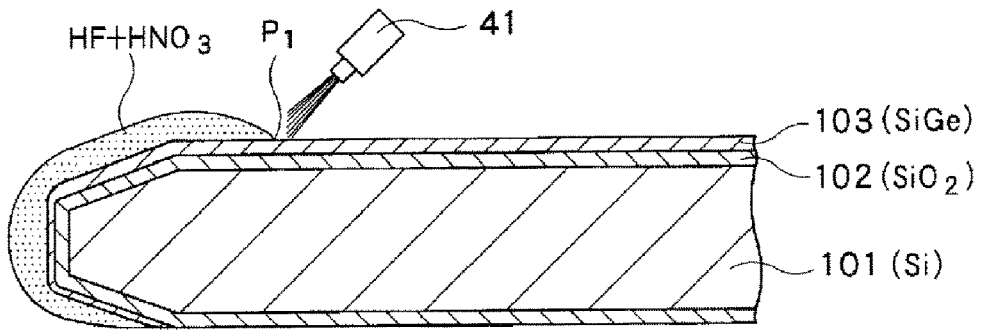
FIG. 8A and FIG. 8B are schematic cross sectional views for describing a processing method performed in a case that the film as shown in FIG. 4 is formed.
Figure 8B:
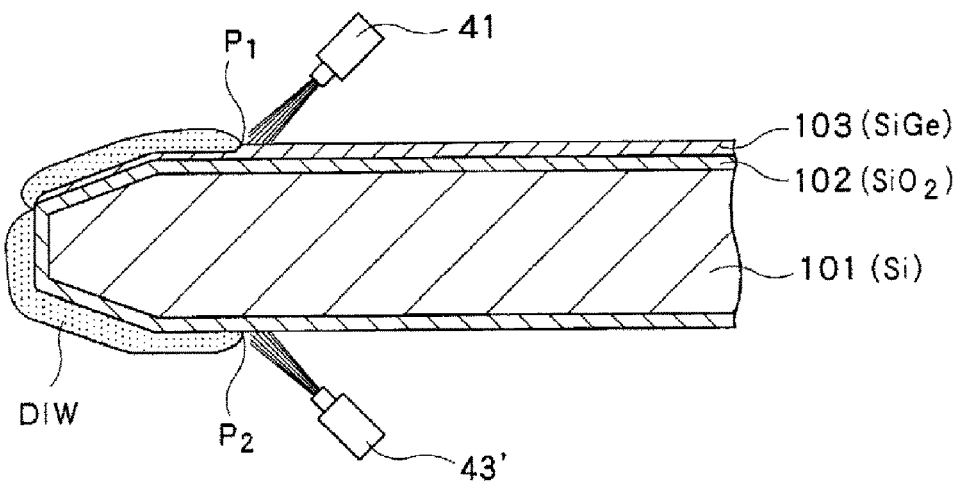

First, as illustrated in FIG. 8A, by supplying the hydrofluoric acid-rich nitrohydrofluoric acid only to the aforementioned position P1 on the front surface of the wafer W, the SiGe film at the peripheral portion of the front surface of the wafer W is etched, and, concurrently, the SiGe film existing at the peripheral end WE of the wafer W and the bevel portion of the rear surface of the wafer W is etched by the nitrohydrofluoric acid which goes around the rear surface of the wafer by a surface tension after being supplied onto the front surface of the wafer. At this time, by adjusting a supply flow rate of the nitrohydrofluoric acid and a rotation number of the wafer W appropriately, a range covered by the nitrohydrofluoric acid can be adjusted. If the etching is continued, the upper layers (e.g., the aforementioned second layer 103b and the third layer 103c) of the relatively thin SiGe film existing at the peripheral end WE of the wafer and the bevel portion of the rear surface of the wafer are first removed. If so, before the lower layers (e.g., the aforementioned first layer 103a and the second layer 103b) of the SiGe film are removed, the DIW is supplied onto the aforementioned position P2 on the rear surface of the wafer W from the rinse nozzle 42', as illustrated in FIG. 8B, so that the nitrohydrofluoric acid which attempts to go around the peripheral end WE of the wafer and the rear surface of the wafer is blocked by the DIW which goes around the front surface of the wafer. Accordingly, the etching of the SiGe film existing at the peripheral end WE of the wafer and the bevel portion of the rear surface of the wafer W is stopped. Thereafter, if the upper layers of the SiGe film existing at the peripheral portion of the front surface of the wafer W are removed, the nitric acid-rich nitrohydrofluoric acid is supplied to the aforementioned position P1 and the nitrohydrofluoric acid covers the peripheral portion of the front surface, the peripheral end WE and the bevel portion WB of the rear surface of the wafer W, as shown in FIG. 8A. Then, the etching is performed until the lower layers of the SiGe film are completely removed.

Figure 9:
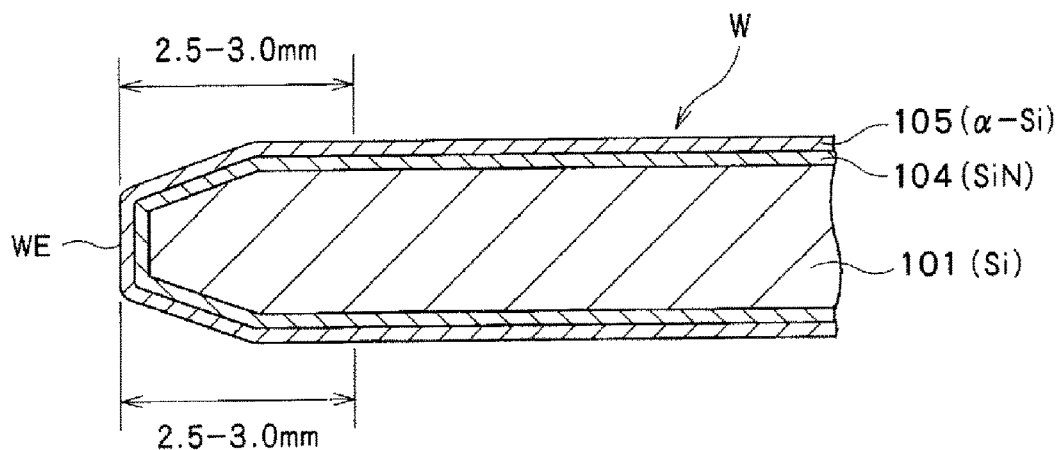
FIG. 9 is a schematic cross sectional view for describing a wafer used in an experiment.

Now, a result of an experiment for investigating an effect of the organic material removing process, which is performed before an amorphous silicon film is etched by using the nitrohydrofluoric acid, will be explained. As shown in FIG. 9, there is prepared a processing target substrate (hereinafter, referred to as "wafer") having, on a silicon wafer 101, a SiN film 104 as a lower layer and an amorphous silicon film 105. While rotating this wafer horizontally around the vertical axis line, the organic material removing process is performed by supplying the SC-1 solution to the wafer peripheral portions from the pre-processing nozzles 43 and 43' shown in FIG. 2; the rinsing process is then performed by supplying the DIW to the wafer peripheral portions from the rinse nozzles 42 and 42'; the nitrohydrofluoric acid processing process is then performed to remove the amorphous silicon film 105 up to a position about 2.5 mm to 3 mm inward from a peripheral end (Apex) WE of the wafer in the radial direction by supplying the nitrohydrofluoric acid to the wafer peripheral portions from the chemical liquid nozzles 41 and 41'; the rinsing process is then performed again; and, finally, the scattering and drying process is performed. This is referred to as an experimental example. As a comparative example, the organic material removing process and the first rinsing process are omitted from the above-described series of processes.

Figure 10A:
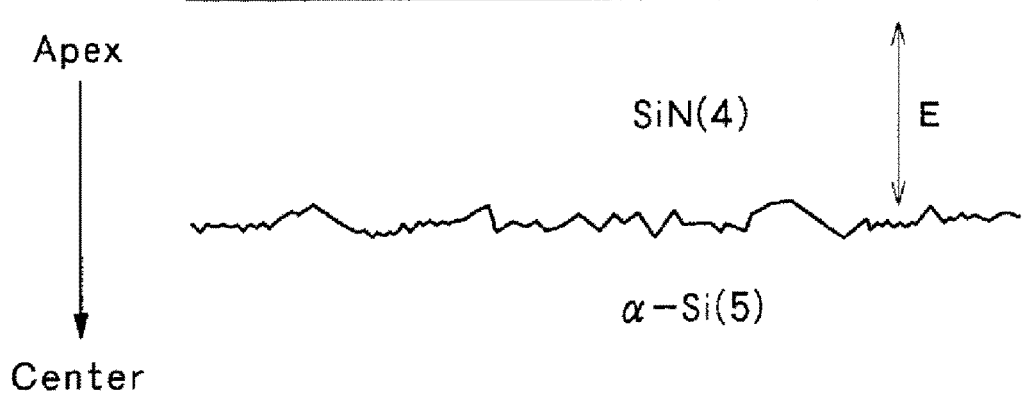
FIG. 10A and FIG. 10B are schematic diagrams illustrating a state of a film after etching is performed in the experiment.
Figure 10B:
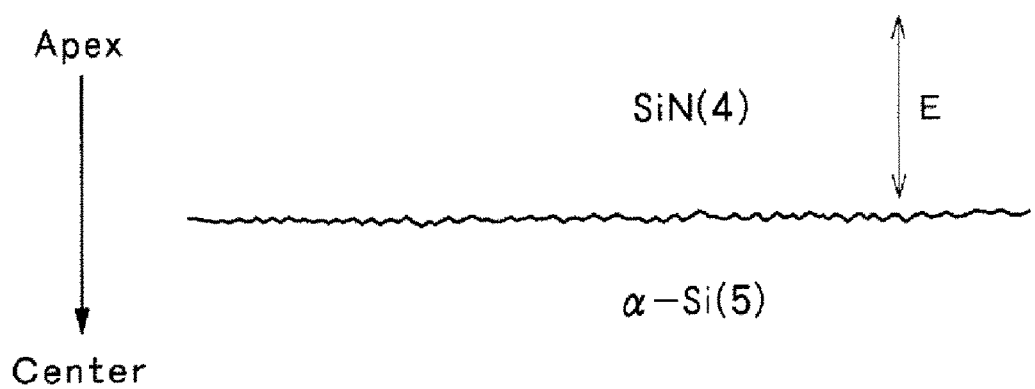

FIG. 10A and FIG. 10B illustrate images of the wafer bevel portions after the processings, which are captured by a scanning electron microscope. Images are continuously captured along the peripheral portion of the wafer and then are developed such that the peripheral end (Apex) WE of the wafer having an arc shape has a straight line-shaped contour. In each of FIG. 10A and FIG. 10B, "E" denotes an etching range, and a jagged line indicates a contour of a circumference edge of the amorphous silicon film 105. In case that there is performed no organic material removing process, the circumference edge of the amorphous silicon film 105 is found to have a contour with a large irregularity, as shown in FIG. 10A. Meanwhile, in the case where the organic material removing process is performed, a large irregularity is not found at the contour of the circumference edge of the amorphous silicon film 105, as depicted in FIG. 10B. That is, it is found out that, by performing the organic material removing process before the nitrohydrofluoric acid processing process, the amorphous silicon film 105 is uniformly etched by the nitrohydrofluoric acid.

We claim:

1. A substrate processing method of processing a peripheral portion of a substrate, the substrate processing method comprising:
   a substrate rotating process of holding and rotating the substrate having an underlying film and a removing target film which is formed on the underlying film and made of any one of silicon germanium, amorphous silicon and polysilicon;
   a first processing process of etching the removing target film by supplying onto the peripheral portion of the substrate being rotated a first processing liquid containing hydrofluoric acid and nitric acid at a first mixing ratio; and
   a second processing process of etching the removing target film by, after supplying the first processing liquid onto the substrate, supplying onto the peripheral portion of the substrate being rotated a second processing liquid containing the hydrofluoric acid and the nitric acid at a second mixing ratio in which a content ratio of the hydrofluoric acid is lower and a content ratio of the nitric acid is higher than in the first processing liquid.

2. The substrate processing method of claim 1, further comprising:
   a pre-processing process of supplying, before the first processing process, an organic material cleaning solution onto the peripheral portion of the substrate being rotated.

3. The substrate processing method of claim 1,
   wherein the removing target film comprises an upper layer and a lower layer which is formed under the upper layer and thinner than the upper layer,
   the first processing process is performed only for a time period during which the upper layer is etched, and the second processing process is performed only for a time period during which the lower layer is etched.

4. The substrate processing method of claim 3, further comprising:

a rinsing process of rinsing the substrate by using DIW after a completion of the first processing process and before a start of the second processing process.

5. The substrate processing method of claim 1, wherein the substrate has the underlying film made of $SiO_2$ under the removing target film.

\* \* \* \* \*